(12) United States Patent
Shin et al.

(10) Patent No.: US 10,699,936 B2
(45) Date of Patent: Jun. 30, 2020

(54) SUBSTRATE PROCESSING SYSTEM

(71) Applicant: Samsung Display Co., LTD., Yongin-si, Gyeonggi-Do (KR)

(72) Inventors: Dongseok Shin, Asan-si (KR); Bongsub Song, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 341 days.

(21) Appl. No.: 15/084,827

(22) Filed: Mar. 30, 2016

(65) Prior Publication Data

US 2017/0047236 A1 Feb. 16, 2017

(30) Foreign Application Priority Data

Aug. 11, 2015 (KR) .................. 10-2015-0113457

(51) Int. Cl.
*H01L 21/687* (2006.01)
*H01L 21/67* (2006.01)
*H01L 21/677* (2006.01)

(52) U.S. Cl.
CPC .. *H01L 21/68785* (2013.01); *H01L 21/67167* (2013.01); *H01L 21/67754* (2013.01); *H01L 21/67769* (2013.01); *H01L 21/67781* (2013.01); *H01L 21/68707* (2013.01); *H01L 21/68771* (2013.01)

(58) Field of Classification Search
CPC .... B25J 9/04; B25J 9/041; B25J 9/107; H01L 21/67167; H01L 21/67265; H01L 21/67754; H01L 21/67769; H01L 21/67781; H01L 21/68707; H01L 21/68771; H01L 21/68785; Y10S 414/137

USPC ...................... 414/744.5, 937, 938
See application file for complete search history.

(56) References Cited

U.S. PATENT DOCUMENTS 6,299,404 B1 10/2001 Muka et al.
8,545,160 B2 * 10/2013 Sakaue ............ H01L 21/67778
414/217

(Continued)

FOREIGN PATENT DOCUMENTS

JP H08244909 A 9/1996
JP 2012186489 A 9/2012

(Continued)

OTHER PUBLICATIONS

Korean Examination Report for Application No. 10-2015-0113457 dated Jul. 1, 2019.

(Continued)

*Primary Examiner* — Saul Rodriguez
*Assistant Examiner* — Brendan P Tighe
(74) *Attorney, Agent, or Firm* — Cantor Colburn LLP

(57) ABSTRACT

A substrate processing system includes a substrate loading unit which loads a plurality of substrates, a substrate transfer unit which transfers N (where N is natural number) substrates at the same time from the substrate loading unit, and a substrate processing unit including a plurality of process chambers which receives the N substrates at the same time from the substrate transfer unit and processes the received substrates where each of the process chambers includes a stage on which the N substrates are disposed and an insulation layer disposed between the N substrates.

21 Claims, 16 Drawing Sheets

(56) References Cited

U.S. PATENT DOCUMENTS

| | | | |
|---|---|---|---|
| 2004/0069225 A1* | 4/2004 | Fairbairn | H01L 21/67201 118/715 |
| 2012/0201646 A1* | 8/2012 | Sakaue | H01L 21/67742 414/806 |
| 2013/0057837 A1* | 3/2013 | Ichinose | G03F 7/70341 355/30 |
| 2014/0064886 A1* | 3/2014 | Toshima | H01L 21/677 414/221 |
| 2014/0126980 A1* | 5/2014 | Wamura | H01L 21/67167 414/221 |
| 2014/0370628 A1 | 12/2014 | Sato | |
| 2015/0255258 A1* | 9/2015 | Nozawa | C23C 16/4584 156/345.42 |

FOREIGN PATENT DOCUMENTS

| | | |
|---|---|---|
| JP | 2012222087 A | 11/2012 |
| JP | 2014049667 | 3/2014 |
| KR | 100760992 B1 | 9/2007 |
| KR | 1020090124118 A | 12/2009 |
| KR | 100960773 B1 | 5/2010 |
| KR | 1020140027216 A | 3/2014 |
| KR | 1020140095430 A | 8/2014 |

OTHER PUBLICATIONS

Korean Notice of Allowance for Application No. 10-2019-0115775 dated Jan. 30, 2020 Enumerating the above listed reference.

\* cited by examiner

SUBSTRATE PROCESSING SYSTEM

This application claims priority to Korean Patent Application No. 10-2015-0113457, filed on Aug. 11, 2015, and all the benefits accruing therefrom under 35 U.S.C. § 119, the content of which in its entirety is herein incorporated by reference.

BACKGROUND

1. Field

Exemplary embodiments of the invention herein generally relate to a substrate processing system, and more particularly, to a substrate processing system that is capable of processing a plurality of substrates at the same time.

2. Description of the Related Art

In general, a display apparatus includes a display panel on which a plurality of elements is disposed. When the display panel is manufactured, a metal thin film and inorganic layer for forming the elements may be formed on a substrate.

A substrate processing system is used to form the metal thin film and the inorganic layer on the substrate of the display panel. The substrate processing system includes a cassette accommodating a substrate, a transfer unit for transferring the substrate from the cassette, and a substrate processing apparatus which receives the substrate from the transfer unit to perform a substrate processing process for forming a metal thin film and an inorganic layer.

The substrate processing apparatus includes process chambers for performing various processes to process the substrate. The process chambers may include a sputtering chamber for performing a sputtering process and a chemical vapor deposition chamber for performing a chemical vapor deposition process, for example.

The transfer unit transfers substrates one by one from the cassette to the substrate processing apparatus. The substrate processing apparatus processes the substrates that are supplied one by one.

SUMMARY

Exemplary embodiments of the invention provide a substrate processing system capable of processing a plurality of substrates at the same time.

An exemplary embodiment of the invention provides substrate processing systems including a substrate loading unit which loads a plurality of substrates, a substrate transfer unit which transfers N (where N is natural number) substrates at the same time from the substrate loading unit, and a substrate processing unit including a plurality of process chambers which receives the N substrates at the same time from the substrate transfer unit and processes the received substrates, where each of the process chambers includes a stage on which the N substrates are disposed, and an insulation layer disposed between the N substrates.

In an exemplary embodiment, the substrate loading unit may include a first area on which a plurality of first substrates of the plurality of substrates is loaded to provide a plurality of layers, and a second area on which a plurality of second substrates of the plurality of substrates is loaded to provide a plurality of layers, where a pair of first and second substrates disposed on the same layer is disposed to be spaced apart from each other.

In an exemplary embodiment, the substrate transfer unit may transfer the pair of first and second substrates at the same time from the substrate loading unit.

In an exemplary embodiment, the substrate loading unit may include an upper frame having a frame shape, a front frame connected to one side of the upper frame in a first direction and having a frame shape, the front frame being disposed perpendicular to the upper frame, a rear frame connected to the other side of the upper frame in the first direction and having a frame shape, the rear frame being disposed perpendicular to the upper frame, a first sidewall connected to one side of the upper frame, one side of the front frame, and one side of the rear frame in a second direction crossing the first direction, a second sidewall connected to the other side of the upper frame, the other side of the front frame, and the other side of the rear frame in the second direction, a bottom part connected to a lower portion of the front frame, a lower portion of the rear frame, a lower portion of the first sidewall, and a lower portion of the second sidewall to face the upper frame, a plurality of first support bars disposed on an inner surface of the first sidewall to extend in the second direction, the plurality of first support bars being disposed at a predetermined interval in a third direction crossing the first and second directions and arranged in the first direction, a plurality of second support bars disposed on an inner surface of the second sidewall extend in the second direction, the plurality of second support bars being disposed at a predetermined interval in the third direction and arranged in the first direction, where the plurality of second support bars is disposed to one-to-one correspond to the plurality of first support bars, and a plurality of partition bars disposed at a central portion of the inner surface of the first sidewall and a central portion of the inner surface of the second sidewall in the first direction, the plurality of partition bars being arranged at a predetermined interval in the third direction.

In an exemplary embodiment, the partition bars may be disposed to overlap the first support bars and the second support bars in the first direction, and each of the partition bars may have a length less than that of each of the first and second support bars in the second direction.

In an exemplary embodiment, the first and second support bars disposed at a left side of the partition bars in the first direction and the first and second support bars disposed at a right side of the partition bars in the first direction may be arranged at a uniform interval.

In an exemplary embodiment, the first substrates disposed on the first area defined as an area between the partition bars and the front frame may be disposed one by one on the first and second support bars disposed on the same layer that is defined as the same plane with respect to a plane parallel to the first and second directions, and the second substrates disposed on the second area defined as an area between the partition bars and the rear frame may be disposed one by one on the first and second support bars disposed on the same layer.

In an exemplary embodiment, the substrate transfer unit may include a first support which moves by transfer wheels, a second support disposed on the first support to extend in the third direction, and a plurality of vertically movable robot arms disposed on one side of the second support in the first direction to extend in the first direction.

In an exemplary embodiment, the robot arms may be disposed at an interval less than a distance between the first and second support bars, and each of the robot arms may have a length in the first direction, which is greater than a sum of lengths of the pair of first and second substrates.

In an exemplary embodiment, the robot arms may be inserted into one of a first open region of the front frame and a second open region of the rear frame to dispose the pair of first and second substrates to be transferred and transfer the pair of first and second substrates at the same time.

In an exemplary embodiment, the substrate processing unit may further include a loading chamber which receives the pair of first and second substrates from the substrate transfer unit, and a transfer chamber connected to the loading chamber and in which a carrying robot is disposed, where the process chambers may be connected to the transfer chamber, and the carrying robot provides the pair of first and second substrates from the loading chamber to the process chambers.

In an exemplary embodiment, the stage may include a first stage receiving high-frequency power, and a second stage disposed on the first stage to receive electrostatic adsorption direct current ("DC") power, where the pair of first and second substrates and the insulation layer may be disposed on the second stage.

In an exemplary embodiment, the stage may further include a cooling water supply tube disposed via the inside of the first state and through which cooling water flows.

In an exemplary embodiment, the second stage may include a first sub stage disposed on the first stage, and a second sub stage having a size less than that of the first sub stage in a plan view, the second sub stage being disposed on the first sub stage, where the second sub stage may be disposed so that the second sub stage does not overlap a predetermined area of a boundary of the first sub stage, and the pair of first and second substrates and the insulation layer may be disposed on the second sub stage.

In an exemplary embodiment, the stage may further include a plurality of coupling pins which couples the first sub stage to the first stage in the predetermined area of the boundary of the first sub stage.

In an exemplary embodiment, a trench may be recessed downward from a top surface of the second sub stage on a predetermined area of a central portion of the second sub stage, and the insulation layer may be disposed in the trench.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
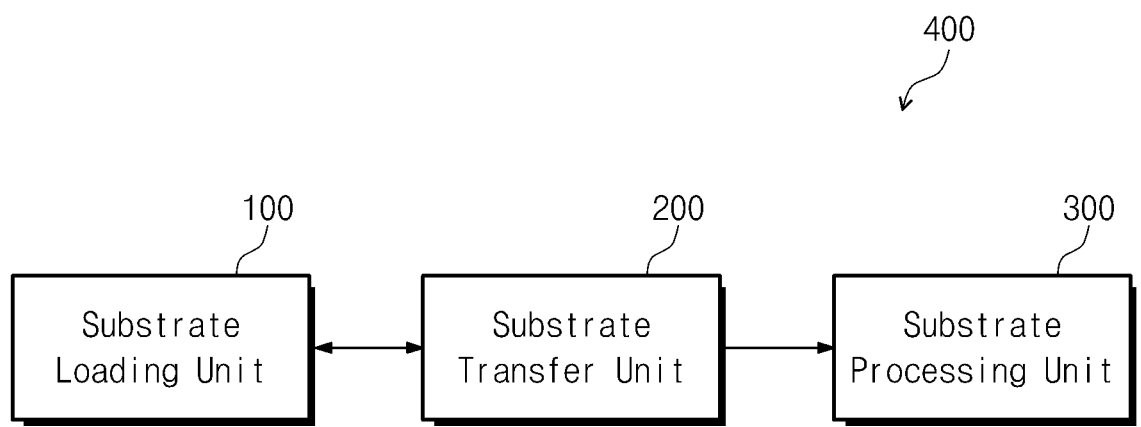
FIG. 1 is a schematic block diagram of an exemplary embodiment of a substrate processing system according to the invention.

Advantages and features of the invention, and implementation methods thereof will be clarified through following embodiments described with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the invention to those skilled in the art. Further, the disclosure is only defined by scopes of claims. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the invention. Like reference numerals refer to like elements throughout.

It will be understood that although the terms of first and second are used herein to describe various elements, these elements should not be limited by these terms. These terms are only used to distinguish one component from another component. Accordingly, a first component that will be described below may be a second component within the technical idea of the disclosure.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The embodiment in the detailed description will be described with schematic cross-sectional views and/or plan views as ideal exemplary views of the invention. Accordingly, shapes of the exemplary views may be modified according to manufacturing techniques and/or allowable errors. Therefore, the embodiments of the invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the invention.

Hereinafter, exemplary embodiments of the invention will be described below in more detail with reference to the accompanying drawings.

FIG. 1 is a schematic block diagram of a substrate processing system according to an exemplary embodiment of the invention.

Referring to FIG. 1, a substrate processing system according to the invention includes a substrate loading unit 100, a substrate transfer unit 200, and a substrate processing unit 300.

A plurality of substrates is loaded on the substrate loading unit 100. The substrate transfer unit 200 transfers the substrates in a predetermined unit number from the substrate loading unit 100. In an exemplary embodiment, the substrate transfer unit 200 may transfer N substrates of the substrates loaded on the substrate loading unit 100 at the same time, for example, where N is a natural number greater than or equal to 2.

The substrate processing unit 300 receives the N substrates from the substrate transfer unit 200 at the same time. The substrate processing unit 300 includes a plurality of process chambers. The N substrates supplied from the substrate transfer unit 200 may be processed in each of the process chambers at the same time. Thus, the substrate processing system 400 according to the invention may improve process efficiency when the substrates are processed.

Figure 2:
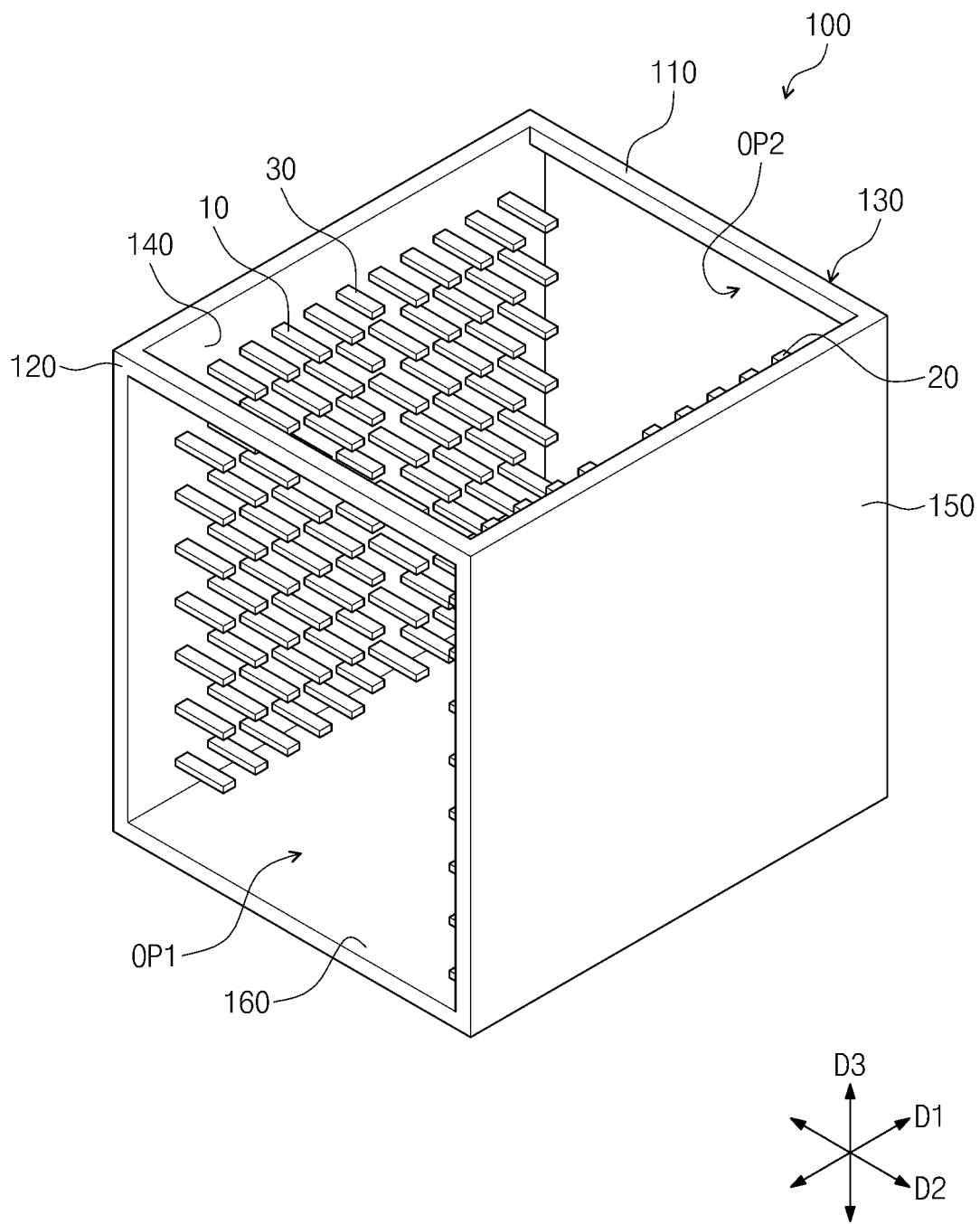
FIG. 2 is a perspective view of a substrate loading unit of FIG. 1.

FIG. 2 is a perspective view of the substrate loading unit of FIG. 1.

Referring to FIG. 2, the substrate loading unit 100 includes an upper frame 110, a front frame 120, a rear frame 130, a first sidewall 140, a second sidewall 150, a bottom part 160, a plurality of first support bars 10, a plurality of second support bars 20, and a plurality of partition bars 30. The substrate loading unit 100 may be defined as a substrate loading cassette.

In an exemplary embodiment, the upper frame 110 has a rectangular frame shape, for example. The upper frame 110 is disposed parallel to a first direction D1 and a second direction D2 crossing the first direction D1.

The front frame 120 has a rectangular frame shape and is connected to one side of the upper frame 110 in the first direction D1. The front frame 120 is disposed perpendicular to the upper frame 110 to extend in a third direction D3 crossing the first and second directions D1 and D2.

In an exemplary embodiment, the rear frame 130 has a rectangular frame shape, for example, and is connected to the other side of the upper frame 110 in the first direction D1. The rear frame 130 is disposed perpendicular to the upper frame 110 to extend in the third direction D3. The rear frame 130 is disposed to face the front frame 120.

The first sidewall 140 is connected to one side of the upper frame 110, one side of the front frame 120, and one side of the rear frame 130 in the second direction D2.

The second sidewall 150 is connected to the other side of the upper frame 110, the other side of the front frame 120, and the other side of the rear frame 130 in the second direction D2. The second sidewall 150 is disposed to face the first sidewall 140.

The bottom part 160 is disposed to face the upper frame 110. The bottom part 160 is connected to a lower portion of the front frame 120, a lower portion of the rear frame 130, a lower portion of the first sidewall 140, and a lower portion of the second sidewall 150 in the third direction D3.

The first support bars 10 are disposed on an inner surface of the first sidewall 140 to extend in the second direction D2. The first support bars 10 are disposed to be spaced from each other by a predetermined distance in the third direction D3 and arranged in the first direction D1.

The second support bars 20 are disposed on an inner surface of the second sidewall 150 to extend in the second direction D2. The second support bars 20 are disposed to be spaced from each other by a predetermined distance in the third direction D3 and arranged in the first direction D1. The second support bars 20 are symmetrically disposed to one-to-one correspond to the first support bars 10.

The partition bars 30 are disposed at central portions of the inner surfaces of the first and second sidewalls 140 and 150 in the first direction D1 to extend in the second direction D2. The partition bars 30 are arranged to be spaced from each other by a predetermined distance in the third direction D3. Here, the partition bars 30 may be arranged in one line in the third direction D3.

The partition bars 30 are disposed to overlap the first and second support bars 10 and 20 in the first direction D1. A length of each of the partition bars 30 in the second direction D2 is less than that of each of the first and second support bars 10 and 20.

The first support bars 10 disposed at a left side of the partition bars 30 and the first support bars 10 disposed at a right side of the partition bars 30 in the first direction may be arranged at a uniform interval in the first direction D1. The second support bars 20 disposed at a left side of the partition bars 30 and the second support bars 20 disposed at a right side of the partition bars 30 in the first direction may be arranged at a uniform interval in the first direction D1.

Hereinafter, a rectangular frame-shaped open region of the front frame 120 is referred to as a first opening part OP1, and a rectangular frame-shaped open region of the rear frame 130 is referred to as a second opening part OP2. Areas of the first and second support bars 10 and 20 disposed on the same plane with respect to a plane parallel to the first and second direction D1 and D2 may be defined as the same layer.

Figure 3:
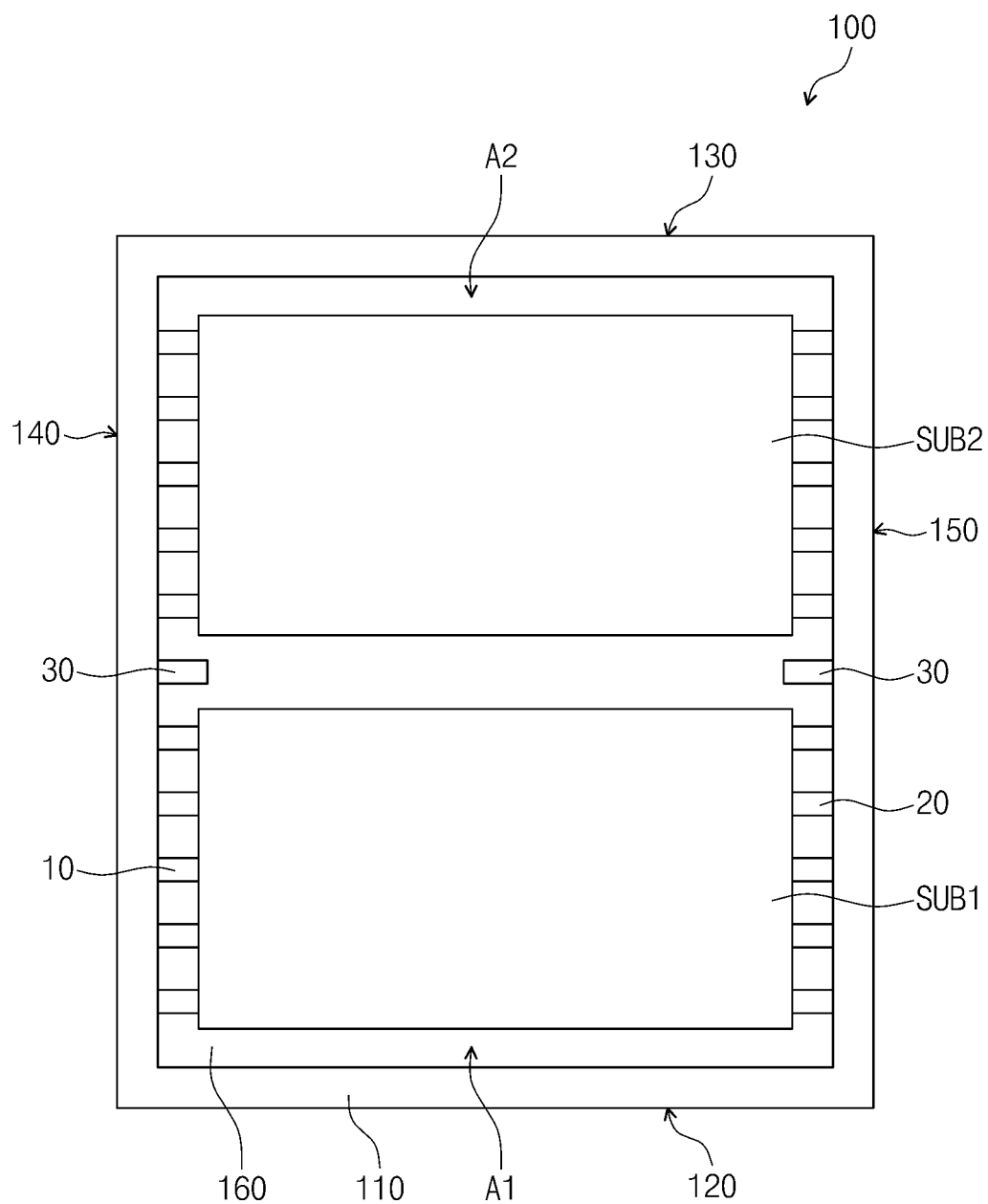
FIG. 3 is a top view of the substrate loading unit when view from the top in a state where substrates are loaded on the substrate loading unit of FIG. 2.
Figure 4:
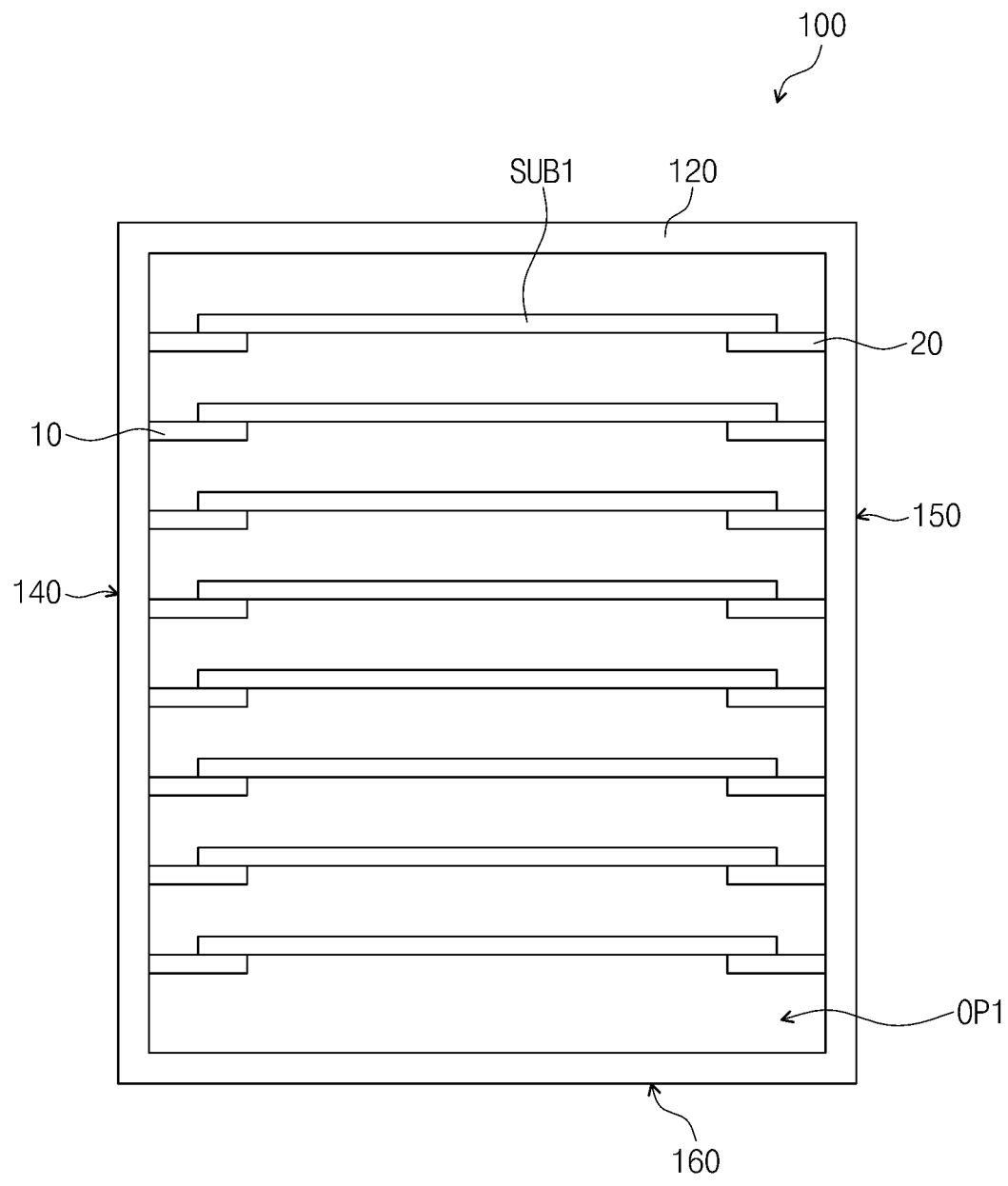
FIG. 4 is a front view of the substrate loading unit when viewed from the front in the state where the substrates are loaded on the substrate loading unit of FIG. 2.
Figure 4:
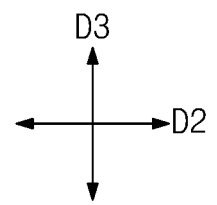

FIG. 3 is a top view of the substrate loading unit when view from the top in a state where substrates are loaded on the substrate loading unit of FIG. 2. FIG. 4 is a front view of the substrate loading unit when viewed from the front in the state where the substrates are loaded on the substrate loading unit of FIG. 2.

Referring to FIGS. 3 and 4, a plurality of substrates SUB1 and SUB2 is loaded on the substrate loading unit 100 to provide a plurality of layers. Hereinafter, in the substrate loading unit 100, an area between the partition bars 30 and the front frame 120 is defined as a first area A1, and an area between the partition bars 30 and the rear frame 130 is defined as a second area A2.

The substrates SUB1 and SUB2 include a plurality of first substrates SUB1 disposed on the first area Al of the substrate loading unit 100 and a plurality of second substrates SUB2 disposed on the second area A2 of the substrate loading unit 100. The first substrates SUB1 are loaded on the first area A1 to provide a plurality of layers, and the second substrates SUB2 are disposed on the second area A2 to provide a plurality of layers.

The first substrates SUB1 are disposed one by one on the first and second support bars 10 and 20 which are disposed on the same layer on the first area A1. In an exemplary embodiment, a predetermined area on one side of each of the first substrates SUB1 is disposed on the first support bars 10 disposed on the same layer in the second direction D2, and a predetermined area on the other side of each of the first substrates SUB1 is disposed on the second support bars 20 disposed on the same layer in the second direction D2, for example.

The second substrates SUB2 are disposed one by one on the first and second support bars 10 and 20 which are disposed on the same layer on the second area A2. The first and second substrates SUB1 and SUB2 are disposed with the partition bars 30 therebetween in the first direction D1. Thus, a pair of first and second substrates SUB1 and SUB2 which are disposed on the same layer is disposed with the partition bars 30 therebetween. The first and second substrates SUB1 and SUB2 may be exposed to the outside by the first and second opening parts OP1 and OP2.

Figure 5:
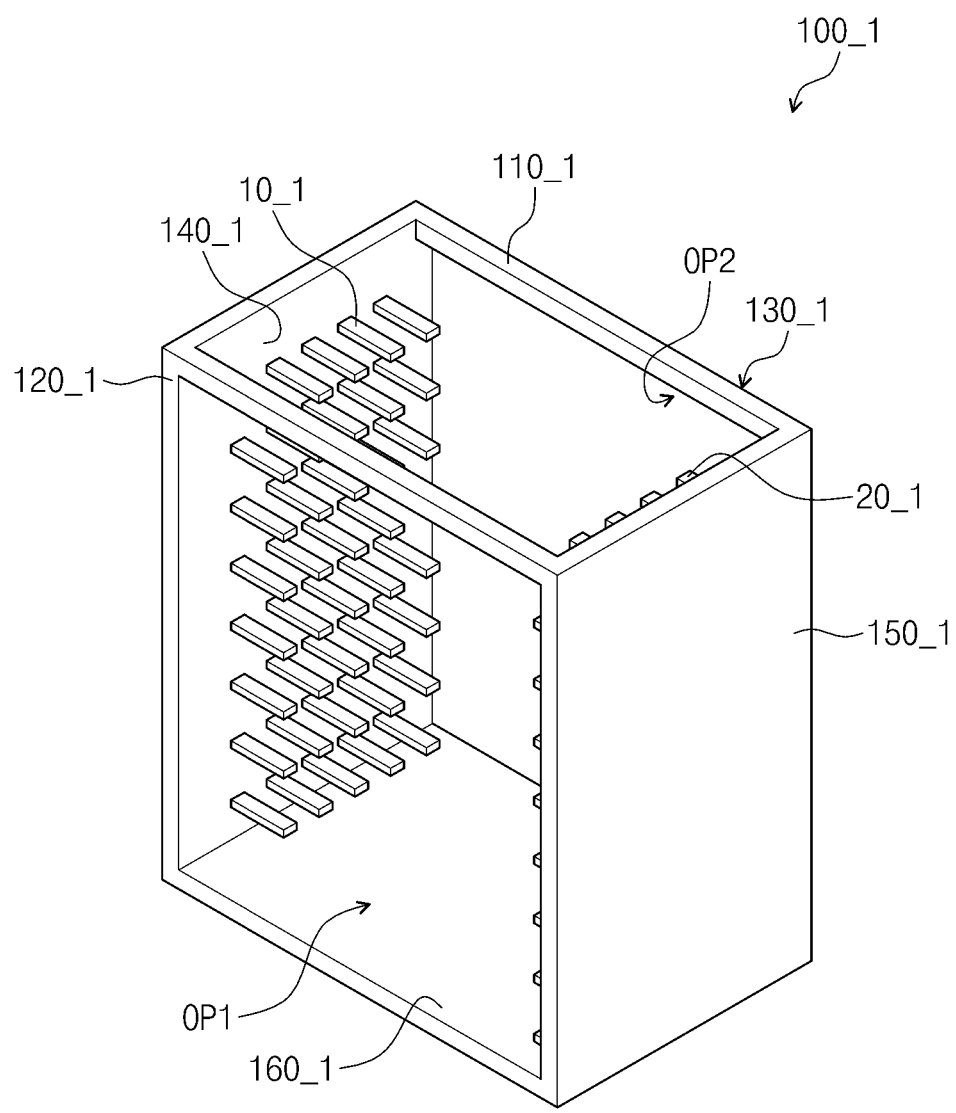
FIG. 5 is a perspective view of another exemplary embodiment of a substrate loading unit according to the invention.
Figure 5:
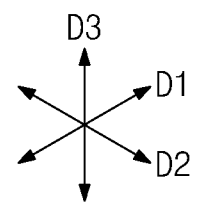

FIG. 5 is a perspective view of a substrate loading unit according to another exemplary embodiment of the invention.

Referring to FIG. 5, a substrate loading unit 100_1 includes an upper frame 110_1, a front frame 120_1, a rear frame 130_1, a first sidewall 140_1, a second sidewall 150_1, a bottom part 160_1, a plurality of first support bars 10_1, and a plurality of second support bars 20_1.

Substantially, the substrate loading unit 100_1 of FIG. 5 may have the same constituent as the substrate loading unit 100 of FIG. 2 except that the substrate loading unit 100_1 has a length corresponding to a half of that of the substrate loading unit 100, and the partition bars 30 are removed.

That is, the upper frame 110_1, the first sidewall 140_1, the second sidewall 150_1, and the bottom part 160_1 may have lengths corresponding to halves of those of the upper frame 110, the first sidewall 140, the second sidewall 150, and the bottom part 160, respectively. Thus, detained constituents of the substrate loading unit 100_1 of FIG. 5 will be omitted below.

The substrates are disposed on the substrate loading unit 100_1 to provide a plurality of layers, and one substrate is disposed on the first and second support bars 10_1 and 20_1 which are disposed on the same layer. The substrate may be a first substrate SUB1 or second substrate SUB2 (refer to FIG. 3). Although two substrates are loaded on each of the layers in the substrate loading unit of FIG. 2, only one substrate may be loaded on each of the layers in the substrate loading unit 100_1 of FIG. 5.

Figure 6:
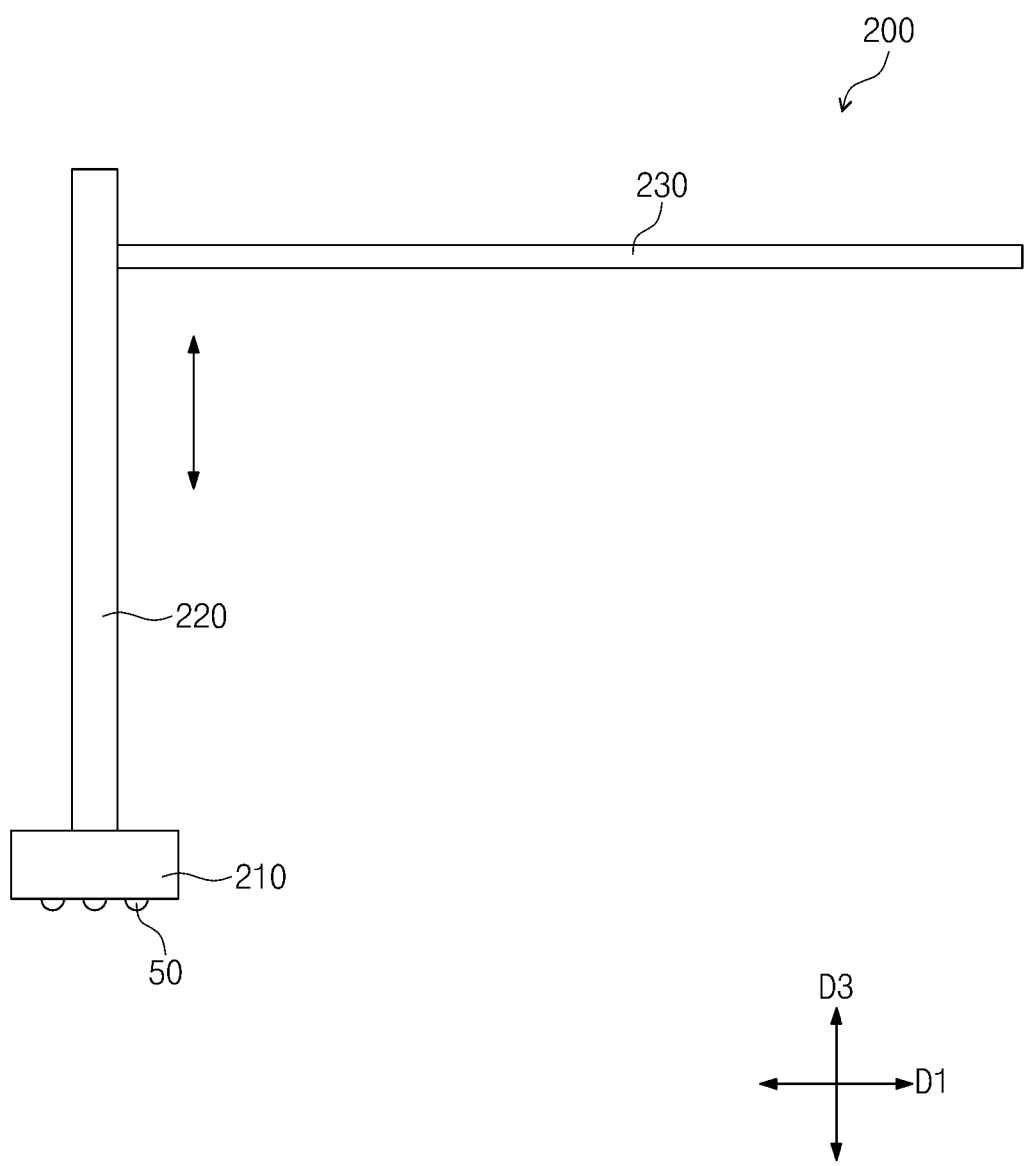
FIG. 6 is a side view of a substrate transfer unit of FIG. 1.
Figure 7:
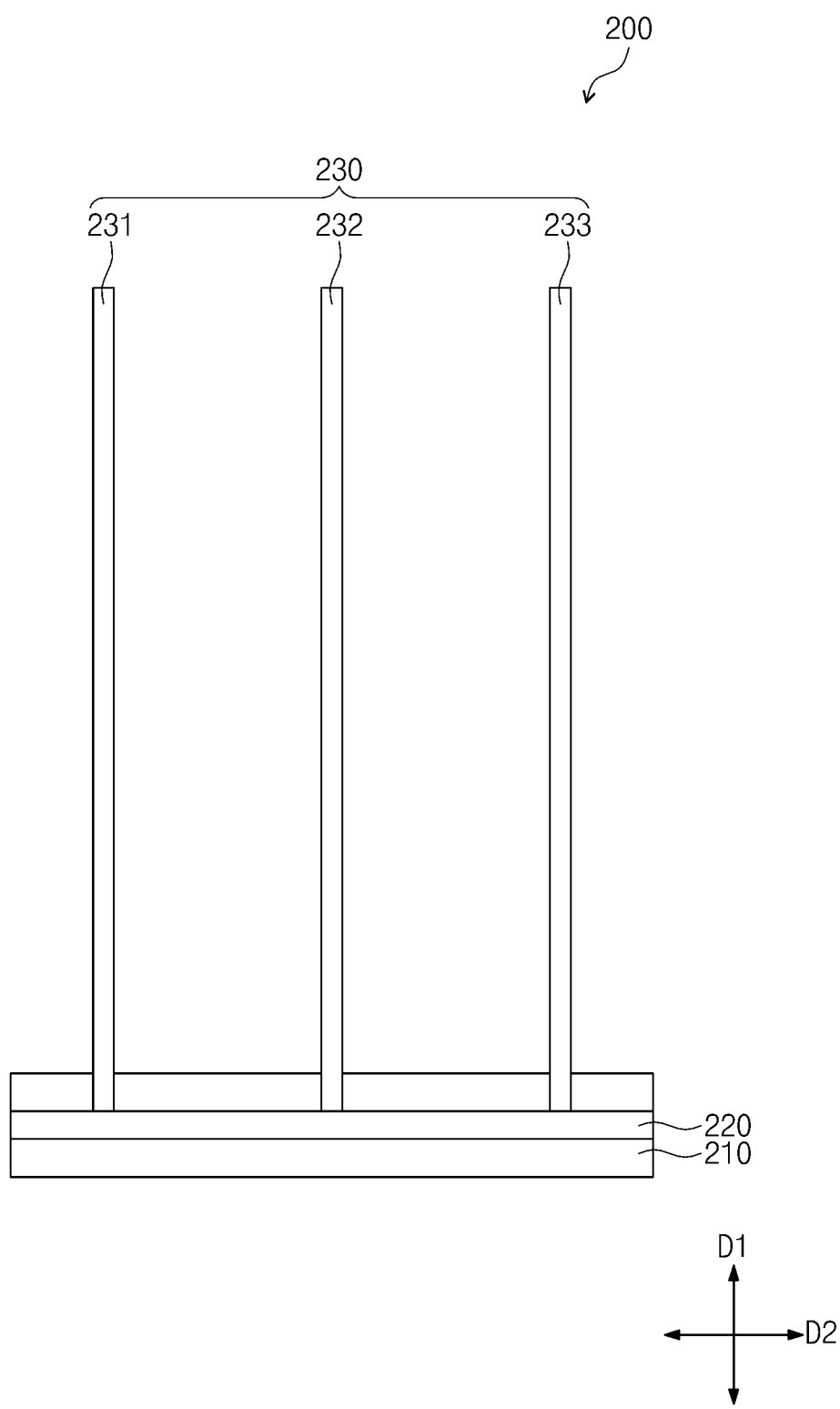
FIG. 7 is atop view of the substrate transfer unit of FIG. 1.

FIG. 6 is a side view of the substrate transfer unit of FIG. 1. FIG. 7 is a top view of the substrate transfer unit of FIG. 1.

Referring to FIGS. 6 and 7, the substrate transfer unit 200 includes a first support 210, a second support 220, a plurality of robot arms 230, and transfer wheels 50. The substrate transfer unit 200 may be defined as a substrate transfer robot. The second support 220 is disposed on the first support 210 to extend upward in the third direction D3.

The robot arms 230 are disposed on one side of the second support 220 in the first direction D1 to extend perpendicular to the second support 220 in the first direction D1. The robot arms 230 may vertically movable at one side of the second support 220. The robot arms 230 may be disposed at the uniform interval in the second direction D2. Although the three robot arms 231, 232, and 233 are exemplified in FIG. 3, the number of robot arms is not limited thereto.

The transfer wheels 50 are disposed on a lower portion of the first support 210 to allow the first support 210 to move in a predetermined direction. Thus, the substrate transfer unit 200 may move in the predetermined direction by the transfer wheels 50.

Figure 8A:
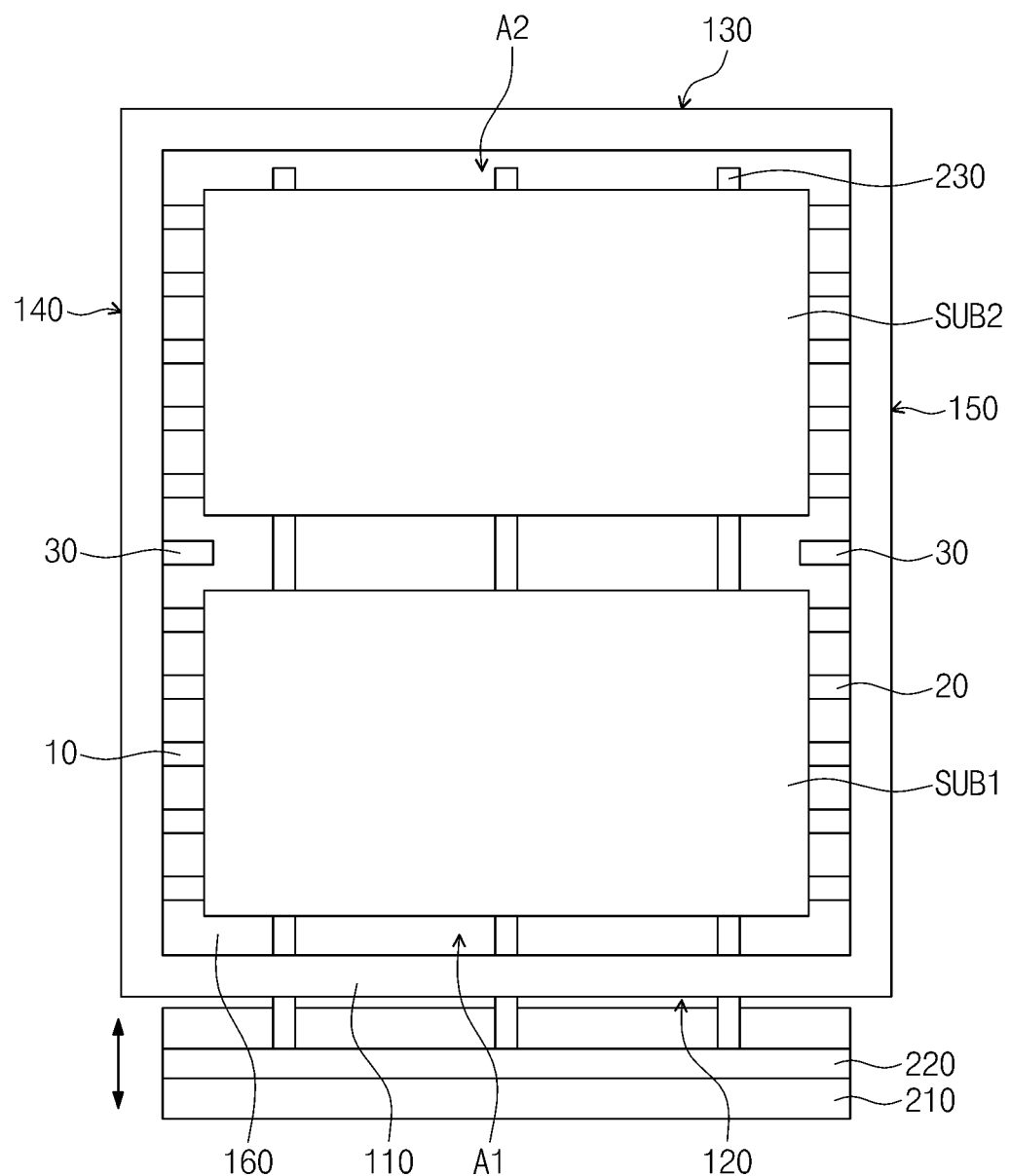
FIGS. 8A and 8B are view for explaining a process in which substrates are transferred from the substrate loading unit of FIGS. 2 to 4.
Figure 8B:
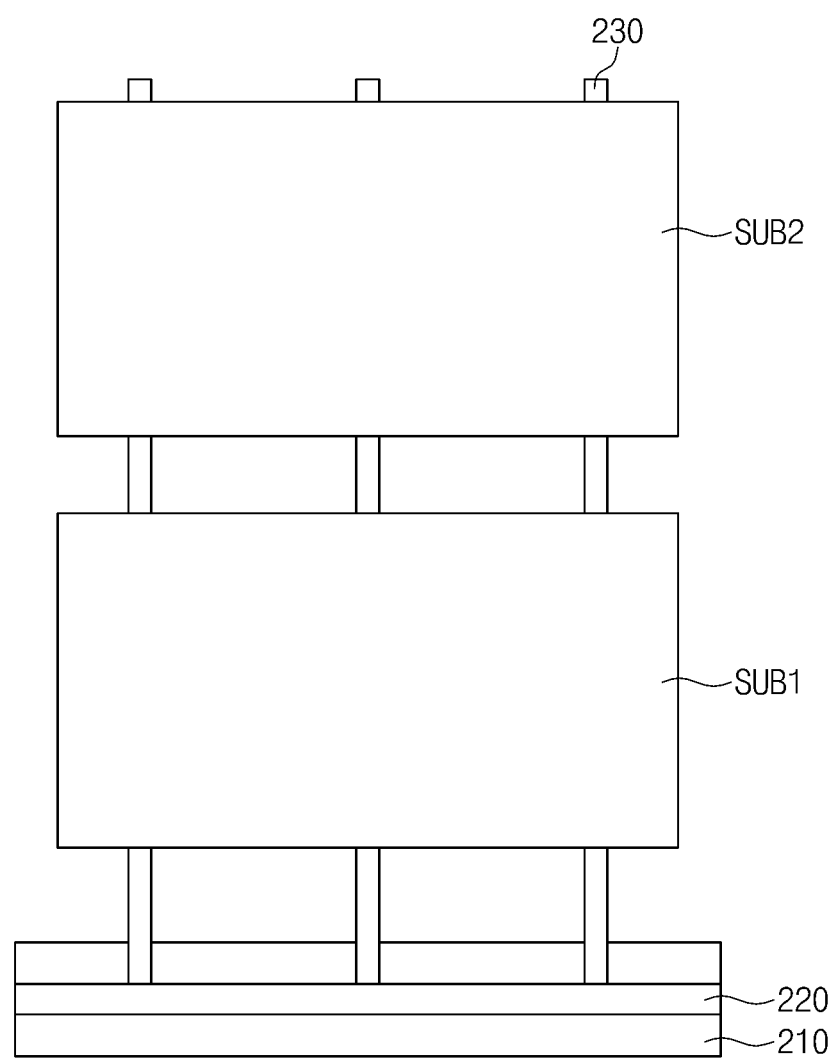

FIGS. 8A and 8B are view for explaining a process in which substrates are transferred from the substrate loading unit of FIGS. 2 to 4.

For convenience of description, the first and second support bars 10 and 20 disposed above the first and second substrates SUB1 and SUB2 are not illustrated in FIGS. 8A and 8B.

Referring to FIGS. 8A and 8B, the substrate transfer unit 200 (refer to FIGS. 6 and 7) moves to the substrate loading unit 100 (refer to FIGS. 2 to 4). The robot arms 230 of the substrate transfer unit 200 may vertically move to overlap a layer on which the pair of first and second substrates SUB1 and SUB2 to be transferred is disposed.

The robot arms 230 move to be inserted into the first opening part OP1 (refer to FIG. 2) and then be disposed to overlap the pair of first and second substrates SUB1 and SUB2 to be transferred. However, an exemplary embodiment of the invention is not limited thereto. In an exemplary embodiment, the robot arms 230 may move to be inserted into the second opening part OP2 (refer to FIG. 2) and then be disposed to overlap the pair of first and second substrates SUB1 and SUB2 to be transferred, for example.

The robot arms 230 are disposed at an interval less than a width of the first opening part OP1 and less than a distance between the first and second support bars 10 and 20. Thus, although the robot arms 230 are inserted into the first opening part OP1, the robot arms 230 may not collide with the first and second support bars 10 and 20.

The robot arms 230 are disposed under the pair of first and second substrates SUB1 and SUB 2 to be transferred. The robot arms 230 move upward by a predetermined distance, and the pair of first and second substrates SUB1 and SUB2 disposed on the same layer is disposed (e.g., seated) on the robot arms 230.

Each of the robot arms 230 has a length in the first direction D1, which is greater than the sum of lengths of the first and second substrates SUB1 and SUB2. Thus, the pair of first and second substrates SUB1 and SUB2 may be seated on the robot arms 230 at a time.

The substrate transfer unit 200 moves the robot arms 230, on which the pair of first and second substrates SUB1 and SUB2 is seated, to the outside of the substrate loading unit 100. The substrate transfer unit 200 transfers the pair of first and second substrates SUB1 and SUB2 seated on the robot arms 230 to the substrate processing unit 300. Thus, the two substrates may be transferred at the same time by the substrate transfer unit 200.

In an exemplary embodiment of the invention, the substrate loading unit 100 for loading the two substrates on the same layer and the substrate transfer unit 200 for transferring the two substrates at the same time have been described. However, an exemplary embodiment of the invention is not limited thereto. In an exemplary embodiment, two or more substrates may be loaded on the same layer of the substrate loading unit 100, and the substrate transfer unit 200 may transfer more than two substrates at the same time, for example.

That is, when the substrate loading unit 100 of FIG. 2 further extends in the first direction D1, more than two substrates may be disposed on the same layer. Also, when the robot arms 230 of FIGS. 6 and 7 further extend in the first direction D1, more than two substrates may be transferred at the same time by the robot arms 230. Thus, in an exemplary embodiment of the invention, N substrates may be transferred at the same time.

FIGS. 9A to 9D are view for explaining a process in which substrates are transferred from the substrate loading unit of FIG. 5.

Figure 9A:
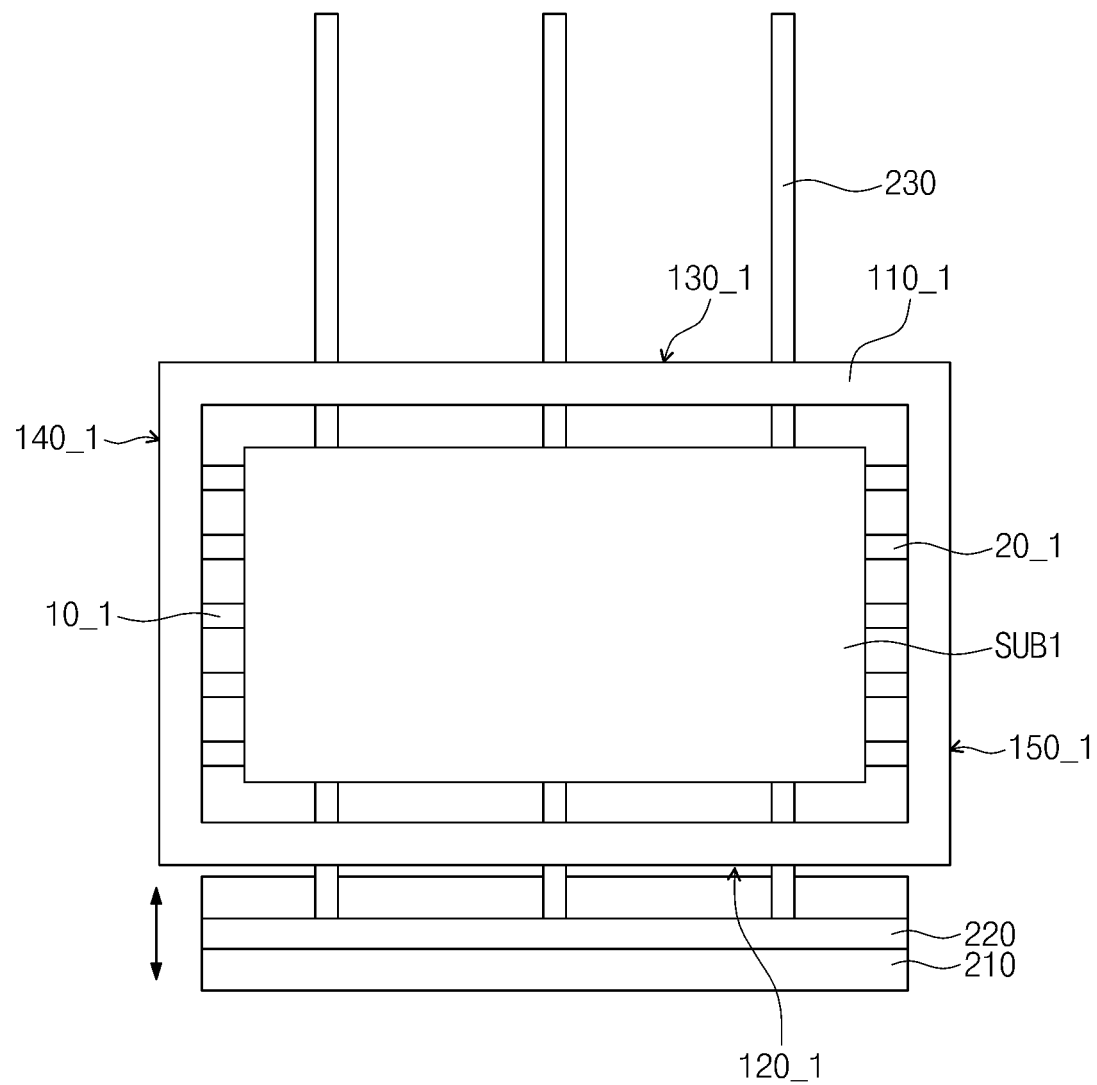
FIGS. 9A to 9D are view for explaining a process in which substrates are transferred from the substrate loading unit of FIG. 5.
Figure 9B:
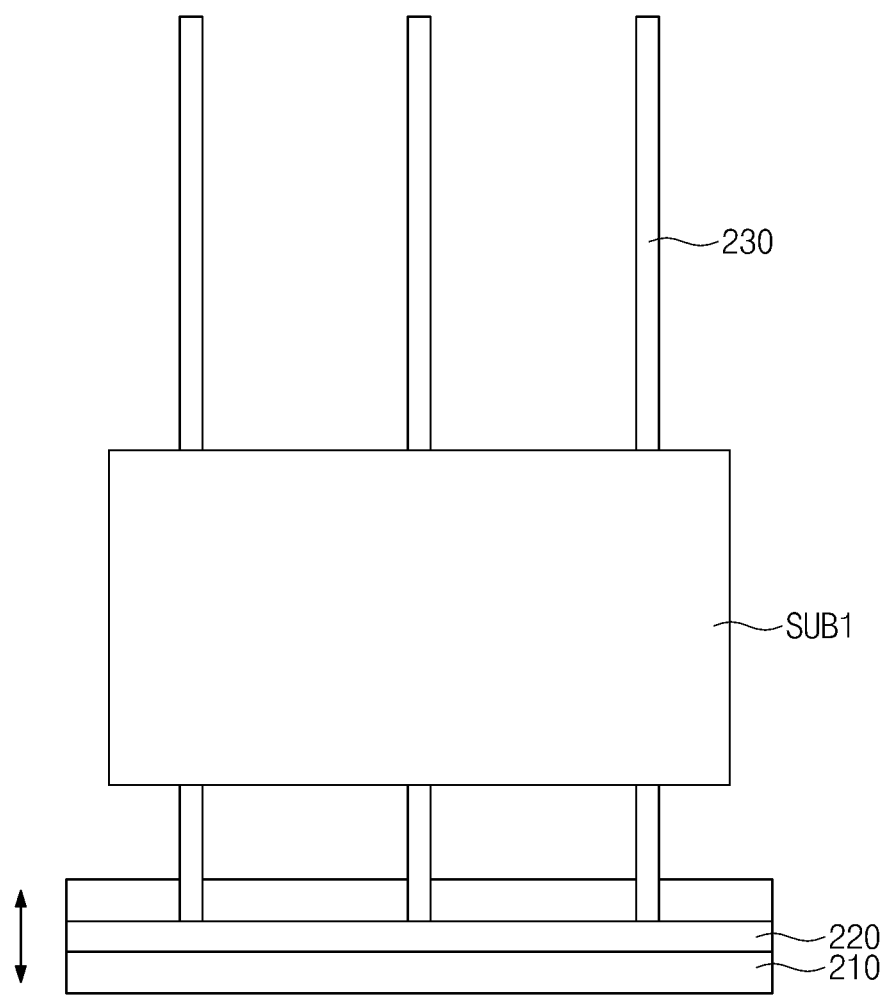

For convenience of description, the first and second support bars 10 and 20 disposed above the first and second substrates SUB1 and SUB2 are not illustrated in FIGS. 9A and 9B.

Referring to FIGS. 9A and 9B, the robot arms 230 of the substrate transfer unit 200 (refer to FIGS. 6 and 7) may vertically move to overlap a layer on which the first substrate SUB1 to be transferred is disposed.

The robot arms 230 are inserted into the first opening part OP1 (refer to FIG. 5) and disposed under the first substrate SUB1 to be transferred. Predetermined areas of the robot arms 230 that are adjacent to the second support 220 are disposed to overlap the first substrate SUB1 to be transferred.

The robot arms 230 move upward by a predetermined distance, and the first substrate SUB1 is seated on the predetermined areas of the robot arms 230 that are adjacent to the second support 220. The substrate transfer unit 200 moves the robot arms 230, on which the first substrate SUB1 is seated, to the outside of the substrate loading unit 100.

Figure 9C:
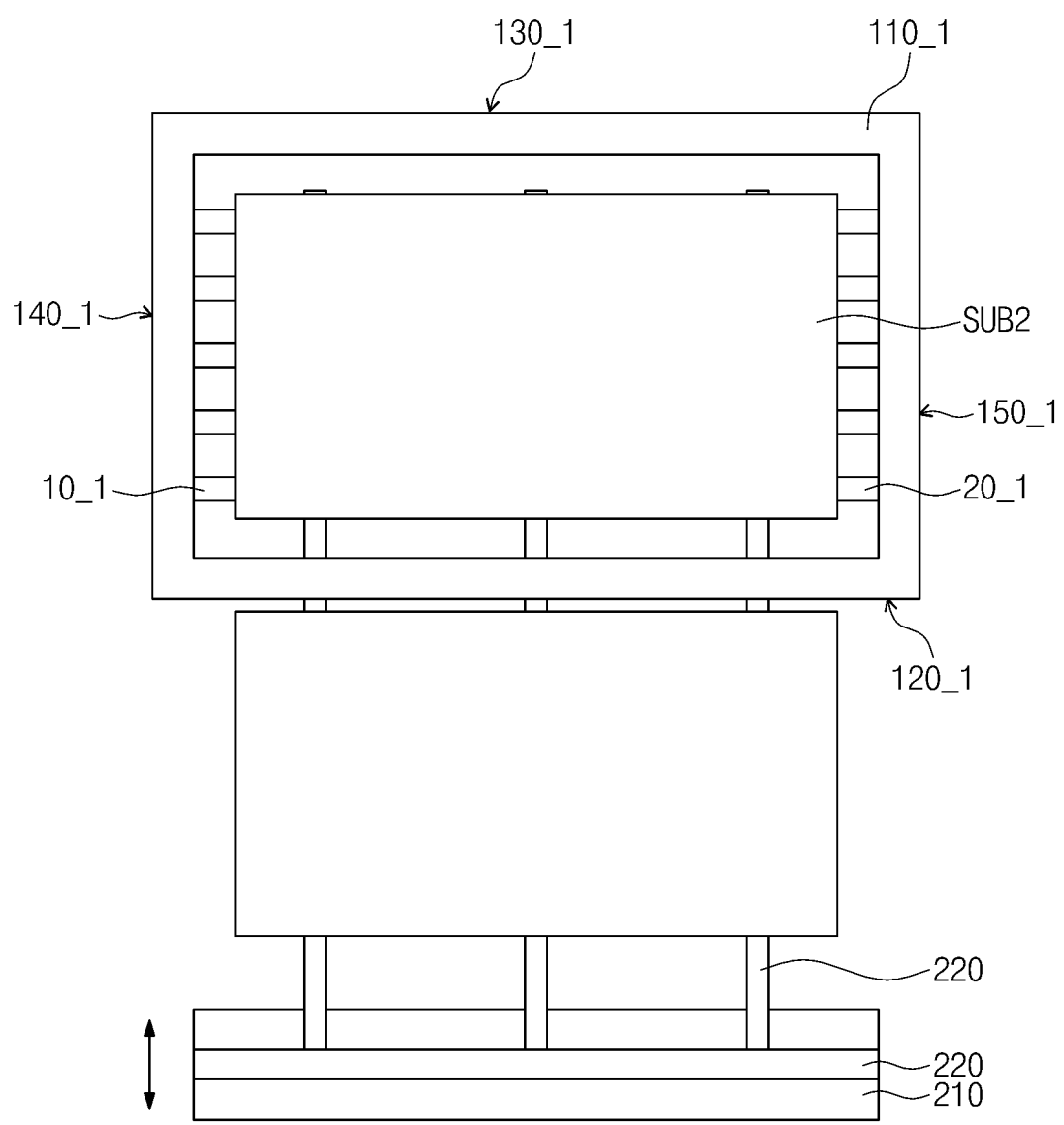
Figure 9D:
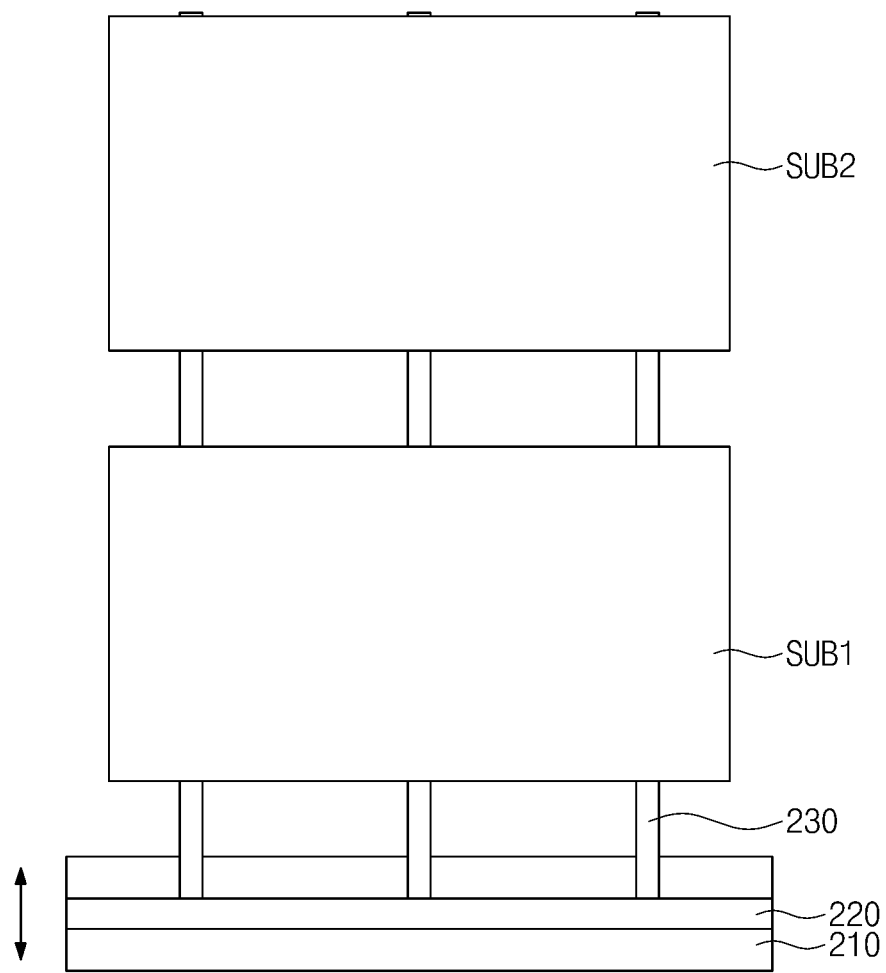

Referring to FIGS. 9C and 9D, the robot arms 230 of the substrate transfer unit 200 may vertically move to overlap a layer on which the second substrate SUB2 to be transferred is disposed. The second substrate SUB2 is disposed on a layer different from that on which the first substrate SUB1 is disposed.

The robot arms 230 are inserted into the first opening part OP1 and disposed under the second substrate SUB2 to be transferred. Predetermined areas of the robot arms 230 that are adjacent to ends of the robot arms 230 are disposed to overlap the second substrate SUB2 to be transferred. The areas of the robot arms 230 on which the first substrate SUB1 is seated are not inserted into the substrate loading unit 200.

The robot arms 230 move upward by a predetermined distance, and the second substrate SUB2 is seated on the predetermined areas of the robot arms 230 that are adjacent to ends of the robot arms 230. The substrate transfer unit 200 moves the robot arms 230, on which the second substrate SUB2 is seated, to the outside of the substrate loading unit 100. The substrate transfer unit 200 transfers the pair of first and second substrates SUB1 and SUB2 seated on the robot arms 230 to the substrate processing unit 300.

The substrate transfer unit 200 is reciprocated two times to the substrate loading unit 100 to load the two substrates SUB1 and SUB2 on the robot arms 230. Thus, the two substrates SUB1 and SUB2 may be transferred at the same time to the substrate processing unit 300 by the substrate transfer unit 200.

In an exemplary embodiment of the invention, the substrates transfer unit 200 for transferring the two substrates at the same time has been described. However, an exemplary embodiment of the invention is not limited thereto. In an exemplary embodiment, when the robot arms 230 of FIGS. 6 and 7 further extend in the first direction D1, and the substrate transfer unit 200 is reciprocated more than two times to the substrate loading unit 100, the substrate transfer unit 200 may transfer more than two substrates at the same time, for example.

Figure 10:
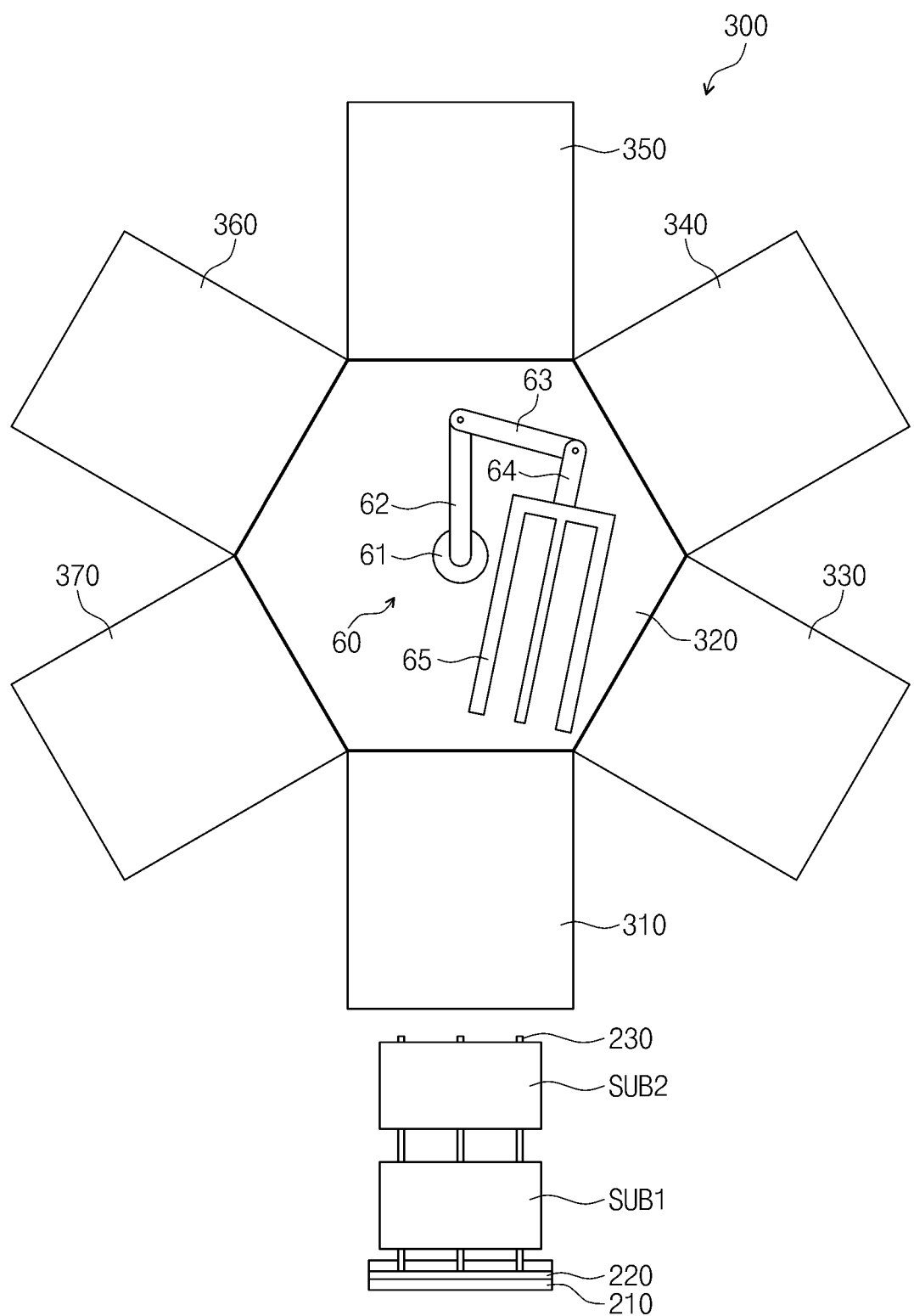
FIG. 10 is a view of a substrate processing unit of FIG. 1.

FIG. 10 is a view of the substrate processing unit of FIG. 1.

Referring to FIG. 10, the substrate processing unit 300 includes a loading chamber 310, a transfer chamber 320, a plurality of process chambers 330 to 370, and a carrying robot 60. The substrate process unit 300 of FIG. 10 may be defined as a clustered substrate processing apparatus.

The loading chamber 310 and the process chambers 330 are connected to a side surface of the transfer chamber 320 having a polygonal shape. In an exemplary embodiment, the transfer chamber 320 has a hexagonal shape, and each of the loading chamber 310 and five process chambers 330 are disposed on a side surface of the transfer chamber 320, for example.

The transfer robot 60 is disposed in the transfer chamber 320. The transfer robot 60 includes a rotation shaft 61, a first robot arm 62, a second robot arm 63, a third robot arm 64, and a plurality of fourth robot arms 65. The first robot arm 62 has one side connected to the rotation shaft 61 and the other side connected to one side of the second robot arm 63. The first robot arm 62 may rotate by using the rotation shaft 61 as a central axis.

The second robot arm 63 has the other side connected to one side of the third robot arm 64. The second robot arm 63 may rotate by using the other side of the first robot arm 62 as a central axis. The third robot arm 64 has the other side connected to one side of the fourth robot arms 65. The third robot arm 64 may rotate by using the other side of the second robot arm 63 as a central axis. The fourth robot arm 65 may have a length that is sufficient to seat two substrates thereon.

The substrate transfer unit 200 (refer to FIGS. 6 and 7) provides the first and second substrates SUB1 and SUB2 to the loading chamber 310. After the loading chamber 310 receives the first and second substrates SUB1 and SUB2, the inside of the loading chamber 310 may be converted into a vacuum state.

The transfer robot 60 may rotate to various angles to provide the first and second substrates SUB1 and SUB2 loaded into the loading chamber 310 to the process chambers 330 to 370. The process chambers 330 to 370 may process the first and second substrates SUB1 and SUB2 at the same time.

In an exemplary embodiment, the first and second substrates SUB1 and SUB2 loaded into the loading chamber 310 may be seated on the fourth robot arms 65 of the transfer robot 60, for example. The first and second substrates SUB1 and SUB2 seated on the fourth robot arms 65 may be provided to the first process chamber 330 as the transfer robot moves and then be processed at the same time.

The first and second substrates SUB1 and SUB2 processed in the first process chamber 330 may be seated again on the fourth robot arms 65. Then, as the transfer robot 60 moves, the first and second substrates SUB1 and SUB2 may be provided to the second process chamber 340 and processed at the same time. The above-described processes may be repeatedly performed to process the first and second substrates SUB1 and SUB2 in the first to fifth process chambers 330 to 370.

Although not shown, a gate may be disposed on a boundary between the transfer chamber 320 and the loading chamber 310 and a boundary between the transfer chamber 320 and each of the process chambers 330 to 370. When the first and second substrates SUB1 and SUB2 are transferred as the transfer robot 60 moves, the gate may be opened to insert or withdraw the first and second substrates SUB1 and SUB2 into/from each of the process chambers 330 to 370.

Various processes may be performed in the process chambers 330 to 370. Furthermore, the first and second substrates SUB1 and SUB2 may be processed at the same time so that a metal thin film and inorganic layer are disposed on the first and second substrates SUB1 and SUB2. In an exemplary embodiment, the process chambers 330 to 370 may include a sputtering chamber for performing a sputtering process and a chemical vapor deposition chamber for performing a chemical vapor deposition process, for example.

Figure 11:
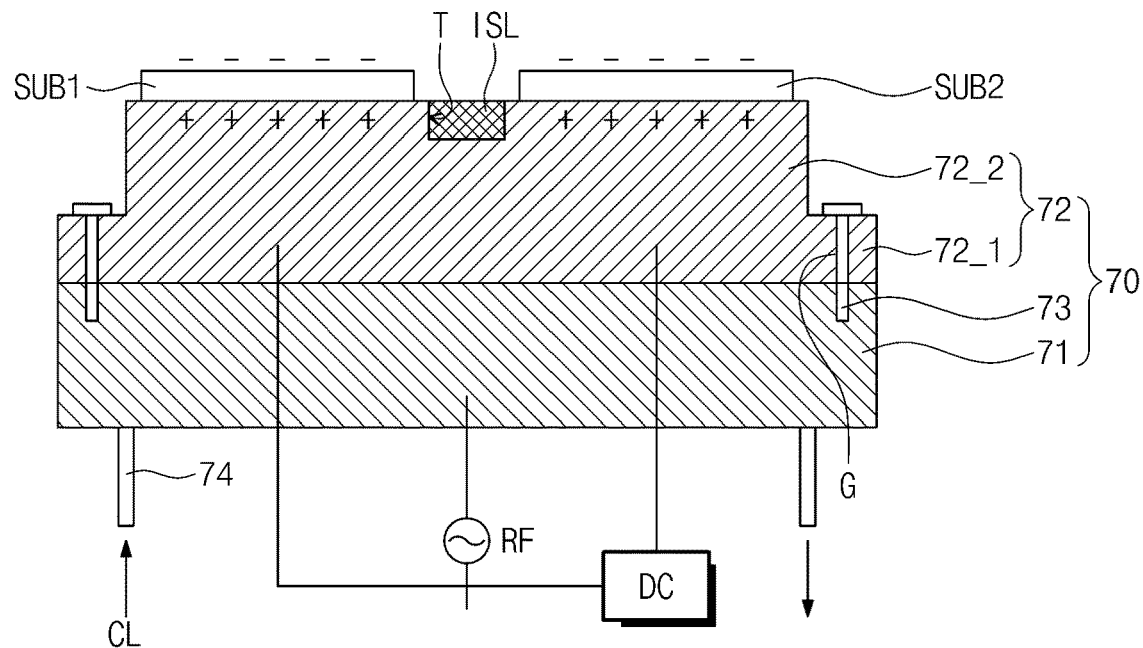
FIG. 11 is a schematic cross-sectional view of a stage disposed in each of process chambers of FIG. 10.
Figure 12:
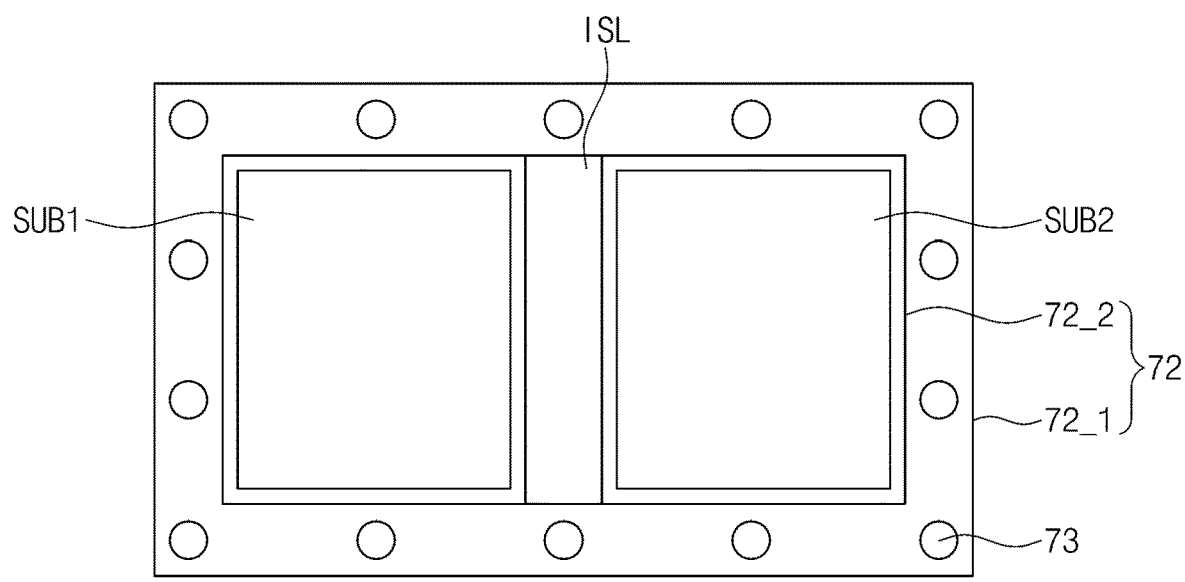
FIG. 12 is a plan view illustrating an upper portion of the stage of FIG. 11.

FIG. 11 is a schematic cross-sectional view of a stage disposed in each of the process chambers of FIG. 10. FIG. 12 is a plan view illustrating an upper portion of the stage of FIG. 11.

Referring to FIGS. 11 and 12, each of the process chambers 330 to 370 (refer to FIG. 10) includes a stage 70 on which the first and second substrates SUB1 and SUB2 are seated and an insulation layer ISL disposed between the first and second substrates SUB1 and SUB2. After the first and second substrates SUB1 and SUB2 are seated on the stage 70, a substrate processing process is performed on the first and second substrates SUB1 and SUB2.

The stage 70 includes a first stage 71, a second stage 72 disposed on the first stage 71, and a plurality of coupling pins 73 for fixing the second stage 72 to the first stage 71.

A high-frequency power source RF for attracting ions from plasma to the first and second substrates SUB1 and SUB2 is provided on the first stage 71. The first stage 71 is heated by the high-frequency power source RF to increases in temperature.

A cooling water supply tube 74 is disposed on a lower portion of the first stage 71. The cooling water supply tube 74 is disposed via the inside of the first stage 72. Cooling water CL is supplied into the cooling water supply tube 74 through one side of the cooling water supply tube 74. The cooling water passes through the inside of the first stage 71 through the cooling water supply tube 74 and then is discharged through the other side of the cooling water supply tube 74. The cooling water CL supplied into the first stage 71 may cool the first stage 71 that is heated by the high-frequency power source RF.

Electrostatic adsorption direct current ("DC") power DC is supplied to the second stage 72. Here, a top surface of the second stage 72 to which the DC power DC is supplied may be charged to positive (+) polarity. Since the top surface of the second stage 72 is charged to the positive (+) polarity, a top surface of each of the first and second substrates SUB1 and SUB2 may be charged to a negative (−) polarity that is opposite to the positive (+) polarity. The first and second substrates SUB1 and SUB2 are adsorbed onto the second stage 72 by electrostatic force of the positive (+) polarity and the negative (−) polarity. Thus, the first and second substrates SUB1 and SUB2 may be seated on the second stage 72.

When the first stage 71 increases in temperature, the second stage 72 may also increase in temperature. However, since the first stage 71 decreases in temperature by the cooling water CL, the second stage 72 disposed on the first stage 71 may also decrease in temperature.

The second stage 72 includes a first sub stage 72_1 disposed on the first stage 71 and a second sub stage 722 disposed on the first sub stage 72_1. The first and second substrates SUB1 and SUB2 are seated on the second sub stage 72_2.

The second sub stage 722 has a size less than that of the first sub stage 72_1 in a plan view. Also, the second sub stage 72_2 is disposed so that the second sub stage 722 does not overlap a predetermined area of a boundary of the first sub stage 72_1 in a plan view.

The coupling pins 73 are disposed on the predetermined area of the boundary of the first sub stage 72_1. The coupling pins 73 passes through the first sub stage 72_1 in a downward direction at the predetermined area of the boundary of the first sub stage 72_1 and then is inserted into grooves G of the first stage 71. Thus, the second stage 72 is coupled to the first stage 71 by the coupling pins 73.

A trench T is defined in a predetermined area of a central portion of the second sub stage 72_2 to extend in one direction. The trench T is recessed downward from a top surface of the second sub stage 72_2 at the predetermined area of the central portion of the second sub stage 72_2. The first and second substrates SUB1 and SUB2 are seated on the second sub stage 72_2 with the trench T therebetween.

The insulation layer ISL includes an insulation material and disposed in the trench T. Thus, the first and second SUB1 and SUB2 are seated on the second sub stage 72_2 with the insulation layer ISL therebetween.

If the insulation layer ISL is disposed on the second stage 72, a phenomenon in which plasma is concentrated between the first and second substrates SUB1 and SUB2 may occur. In this case, arc may be generated between the first and second substrates SUB1 and SUB2 to damage the first and second substrates SUB1 and SUB2.

However, in an exemplary embodiment of the invention, the trench T is defined in the second sub stage 722, and the insulation layer ISL is disposed in the trench T. Thus, the arc may not occur between the first and second substrates SUB1 and SUB2 by the insulation layer ISL including the insulation material. Therefore, the damage of the first and second substrates SUB1 and SUB2 due to the arc may be prevented.

The first and second substrates SUB1 and SUB2 may be seated on the stage 70 of each of the process chambers 330 to 370 by the above-described constituents, and then, the substrate processing process may be performed on the first and second substrates SUB1 and SUB2 at the same time.

Although the stage 70 on which the two substrates are seated is provided as an example, an exemplary embodiment of the invention is not limited thereto. In an exemplary embodiment, more than two substrates may be seated on the stage, for example. In an exemplary embodiment, the stage 70 of FIGS. 11 and 12 may extend horizontally, and the trench T and the insulation layer ISL of FIGS. 11 and 12 are provided in plurality and disposed on the extending stage 70, for example. In this case, more than two substrates may be seated on the stage with the insulation layer ISL therebetween, and the substrate processing process may be performed on the more than two substrates at the same time.

According to the embodiment of the invention, two or more substrates, i.e., N substrates may be transferred to the substrate processing unit 300 at the same time by the substrate transfer unit 200, and the N substrates may be seated on the stage 70 and simultaneously processed in each of the process chambers 330 to 370 of the substrate processing unit 300. Therefore, the substrate processing system 400 (refer to FIG. 1) according to the embodiment of the invention may process the plurality of substrates at the same time to improve the process efficiency when the substrates are processed.

Figure 13:
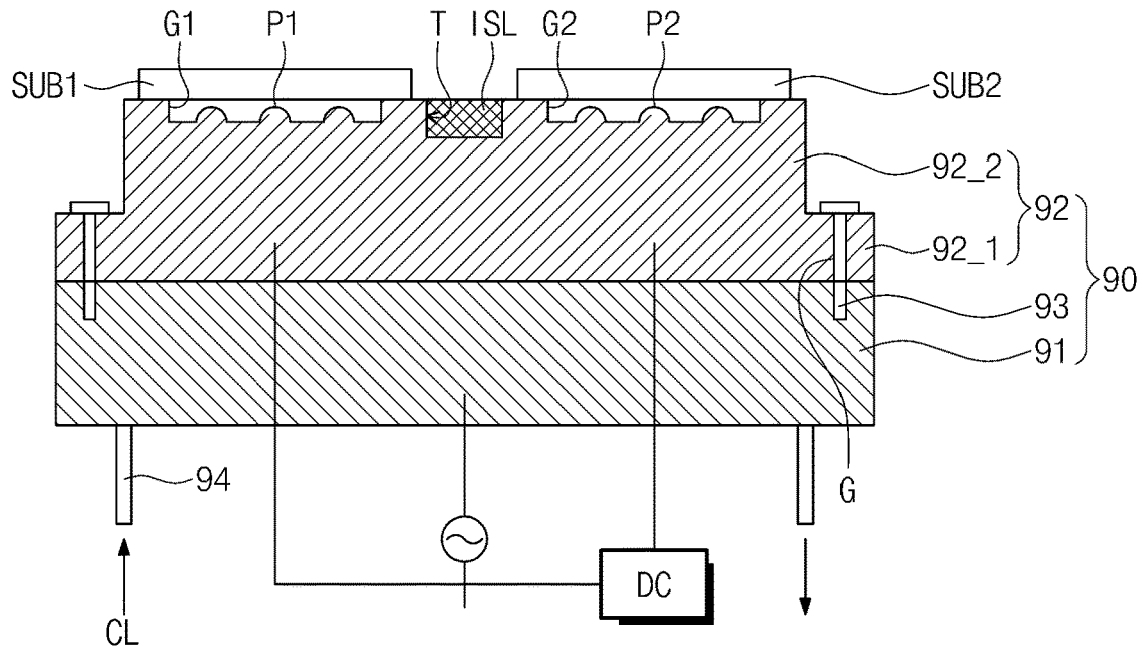
FIG. 13 is a schematic cross-sectional view of another exemplary embodiment of a stage of a substrate processing system according to the invention.
Figure 14:
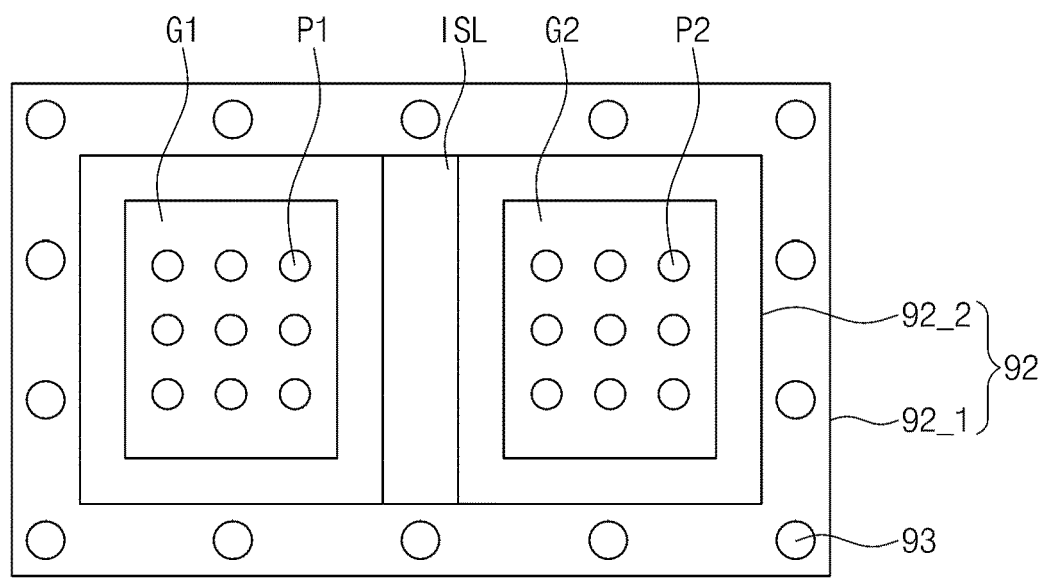
FIG. 14 is a plan view illustrating an upper portion of the stage of FIG. 13.

FIG. 13 is a schematic cross-sectional view of a stage of a substrate processing system according to another exemplary embodiment of the invention. FIG. 14 is a plan view illustrating an upper portion of the stage of FIG. 13.

For convenience of description, first and second substrates SUB1 and SUB2 are not shown in FIG. 14. A stage 90 of FIGS. 13 and 14 has the same constituent as the stage 70 of FIG. 11 except for first and second grooves G1 and G2 and first and second protrusions P1 and P2, which are provided in/on a second sub stage 92_2. Thus, constituents different from those of the stage 90 of FIG. 11 will be described below.

Referring to FIGS. 13 and 14, a stage 90 and an insulation layer ISL are disposed in each of process chambers 330 to 370 (refer to FIG. 10). The stage 90 includes a first stage 91, a second stage 92, and a plurality of coupling pins 93. The second stage 92 includes a first sub stage 92_1 and a second sub stage 92_2. A first groove G1 and a second groove G2 are defined in the second sub stage 92_2 which includes first protrusions P1 and a plurality of second protrusions P2.

The first groove G1 is recessed downward from a top surface of the second sub stage 92_2 at a predetermined area of the second sub stage 92_2 disposed at a left side of the trench T. The second groove G2 is recessed downward from the top surface of the second sub stage 92_2 at a predetermined area of the second sub stage 92_2 disposed at a right side of the trench T.

The first protrusions P1 is disposed in the first groove G1 to protrude upward. The second protrusions P2 is disposed in the second groove G2 to protrude upward. Each of the first and second protrusions P1 and P2 has an upwardly convex shape.

A predetermined area of a boundary of the first substrate SUB1 is disposed to contact the top surface of the second sub stage 92_2 that is adjacent to the first groove G1 defined in the second sub stage 92_2 disposed at the left side of the trench T. A predetermined area of a boundary of the second substrate SUB2 is disposed to contact the top surface of the second sub stage 92_2 that is adjacent to the second groove G2 defined in the second sub stage 92_2 disposed at the right side of the trench T.

The first and second protrusions P1 and P2 are disposed lower than that top surface of the second sub stage 92_2.

Thus, the first and second protrusions P1 and P2 may not contact the first and second substrates SUB1 and SUB2.

A cooling water supply tube 94 may be substantially the same as the cooling water supply tube 74 of FIG. 11, and the repeated description may be omitted.

After the first and second substrates SUB1 and SUB2 are seated on the stage 90, a substrate processing process is performed on the first and second substrates SUB1 and SUB2 at the same time. Thus, the substrate processing system according to another exemplary embodiment of the invention may improve process efficiency when the substrates are processed.

According to the embodiment of the invention, the plurality of substrates may be transferred to the substrate processing unit by the substrate transfer unit, and then the plurality of substrates may be processed in each of the process chambers of the substrate processing unit while being seated on the stage. Therefore, the substrate processing system according to the embodiment of the invention may process the plurality of substrates at the same time to improve the process efficiency when the substrates are processed.

It will be apparent to those skilled in the art that various modifications and variations can be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

What is claimed is:

1. A system comprising:
   a plurality of process chambers for receiving and processing a first substrate for manufacturing a first display panel and a second substrate for manufacturing a second display panel at the same time, each of the plurality of process chambers comprising:
   a stage providing one processing area on which the first substrate and the second substrate are disposed;
   a trench for dividing the one processing area into a first area and a second area on which the first substrate and the second substrate are respectively disposed,
   wherein the trench extends in a first direction in a predetermined area of a central portion of the stage, and in a plane view, a length of the trench in the first direction is greater than a width of the trench in a second direction crossing the first direction.

2. The system of claim 1, further comprising:
   a substrate loading unit which loads a plurality of substrates; and
   a substrate transfer unit which transfers the N substrates at the same time from the substrate loading unit to the loading chamber,
   wherein the substrate loading unit comprises:
   a first loading area on which the first substrate is loaded; and
   a second loading area on which the second substrate is loaded,
   wherein the first substrate and the second substrate disposed on the same layer are disposed to be spaced apart from each other.

3. The system of claim 2, wherein the substrate transfer unit transfers the first substrate and the second substrate at the same time from the substrate loading unit.

4. The system of claim 2, wherein the substrate loading unit further comprises:
an upper frame having a frame shape;
a front frame connected to one side of the upper frame in a first direction and having a frame shape, the front frame being disposed perpendicular to the upper frame;
a rear frame connected to the other side of the upper frame in the first direction and having a frame shape, the rear frame being disposed perpendicular to the upper frame;
a first sidewall connected to one side of the upper frame, one side of the front frame, and one side of the rear frame in a second direction crossing the first direction;
a second sidewall connected to the other side of the upper frame, the other side of the front frame, and the other side of the rear frame in the second direction;
a bottom part connected to a lower portion of the front frame, a lower portion of the rear frame, a lower portion of the first sidewall, and a lower portion of the second sidewall to face the upper frame;
a plurality of first support bars disposed on an inner surface of the first sidewall to extend in the second direction, the plurality of first support bars being disposed at a predetermined interval in a third direction crossing the first and second directions and arranged in the first direction;
a plurality of second support bars disposed on an inner surface of the second sidewall extend in the second direction, the plurality of second support bars being disposed at a predetermined interval in the third direction and arranged in the first direction, wherein the plurality of second support bars is disposed to one-to-one correspond to the plurality of first support bars; and
a plurality of partition bars disposed at a central portion of the inner surface of the first sidewall and a central portion of the inner surface of the second sidewall in the first direction, the plurality of partition bars being arranged at a predetermined interval in the third direction.

5. The system of claim 4, wherein the plurality of partition bars is disposed to overlap the plurality of first support bars and the plurality of second support bars in the first direction, and
each of the plurality of partition bars has a length less than that of each of the first and second support bars in the second direction.

6. The system of claim 4, wherein the first and second support bars disposed at a left side of the plurality of partition bars in the first direction and the first and second support bars disposed at a right side of the plurality of partition bars in the first direction are arranged at a uniform interval.

7. The system of claim 4, wherein the substrate transfer unit comprises:
a first support which moves by transfer wheels;
a second support disposed on the first support to extend in the third direction; and
a plurality of vertically movable robot arms disposed on one side of the second support in the first direction to extend in the first direction.

8. The system of claim 7, wherein the plurality of vertically movable robot arms is disposed at an interval less than a distance between the first and second support bars, and
each of the plurality of vertically movable robot arms has a length in the first direction, which is greater than a sum of lengths of the first substrate and the second substrate.

9. The system of claim 1, further comprising:
a loading chamber receives the first substrate and the second substrate,
a transfer chamber is connected to the loading chamber and a carrying robot is disposed in the transfer chamber, and
wherein the at least one process chamber is connected to the transfer chamber, and the carrying robot provides the first substrate and the second substrate from the loading chamber to the at least one process chamber.

10. The system of claim 9, wherein
the stage comprises:
a first stage; and
a second stage disposed on the first stage,
wherein the trench is formed in a thickness direction of the second stage from an upper surface of the second stage.

11. The system of claim 10, wherein the second stage comprises:
a first sub stage disposed on the first stage; and
a second sub stage having a size less than that of the first sub stage in the plan view, the second sub stage being disposed on the first sub stage,
wherein the trench is formed in a thickness direction of the second sub stage from an upper surface of the second sub stage.

12. The system of claim 11, further comprising a plurality of coupling pins which couples the second stage to the first stage.

13. The system of claim 11, wherein the first sub stage and the second sub stage are integrally formed.

14. The system of claim 10, further comprising a cooling water supply tube which is disposed inside the first state.

15. The system of claim 10, wherein the second stage receives a direct current power.

16. The system of claim 15, wherein the upper surface of the second stage is positively charged.

17. The system of claim 10, wherein the first stage receives a high frequency power.

18. The system of claim 10, wherein the plurality of process chambers comprises a sputtering chamber.

19. The system of claim 10, further comprising an insulation layer disposed in the trench.

20. The system of claim 1, wherein the at least one process chamber is at least one sputtering chamber.

21. A system comprising:
a sputtering chamber for receiving and processing a first substrate for manufacturing a first display panel and a second substrate for manufacturing a second display panel at the same time, the sputtering chamber comprising:
a first stage;
a second stage disposed on the first stage and providing one processing area on which the first substrate and the second substrate are disposed; and
a trench for dividing the one processing area into a first area and a second area on which the first substrate and the second substrate are respectively disposed, the trench formed in a thickness direction of the second stage from an upper surface of the second stage,
wherein the trench extends in a first direction in a predetermined area of a central portion of the second stage, and in a plane view, a length of the trench in the first direction is greater than a width of the trench in a second direction crossing the first direction.

* * * * *